United States Patent
Mohan

(10) Patent No.: US 7,308,024 B2
(45) Date of Patent: Dec. 11, 2007

(54) MODULATION SCHEME FOR FDD/TDD TRANSCEIVERS

(75) Inventor: Chandra Mohan, Carmel, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 1009 days.

(21) Appl. No.: 10/220,118

(22) PCT Filed: Feb. 28, 2001

(86) PCT No.: PCT/US01/06401

§ 371 (c)(1),
(2), (4) Date: Mar. 27, 2003

(87) PCT Pub. No.: WO01/65702

PCT Pub. Date: Sep. 7, 2001

(65) Prior Publication Data

US 2004/0136317 A1    Jul. 15, 2004

Related U.S. Application Data

(60) Provisional application No. 60/185,531, filed on Feb. 28, 2000.

(51) Int. Cl.
    H04B 1/38    (2006.01)
(52) U.S. Cl. .................. 375/219; 375/222; 455/73; 455/74.1

(58) Field of Classification Search ................ 375/130, 375/219, 220, 222, 223, 353, 371, 373, 376; 455/39, 42, 46, 63.1, 63.3, 73, 550.1, 561, 455/74, 74.1
See application file for complete search history.

(56) References Cited

U.S. PATENT DOCUMENTS

| | | | | |
|---|---|---|---|---|
| 3,932,871 A | * | 1/1976 | Foote | 342/28 |
| 4,317,220 A | * | 2/1982 | Martin | 455/503 |
| 4,335,383 A | * | 6/1982 | Berry | 342/115 |
| 4,358,740 A | * | 11/1982 | Dinter | 331/1 A |
| 4,628,518 A | | 12/1986 | Chadwick et al. | 375/88 |
| 6,466,609 B2 | * | 10/2002 | Koslar et al. | 375/139 |

FOREIGN PATENT DOCUMENTS

| GB | 2076238 A | * | 9/1980 |
|---|---|---|---|
| GB | 2076238 | | 11/1981 |

* cited by examiner

Primary Examiner—Chieh M. Fan
Assistant Examiner—Naheed Ejaz
(74) Attorney, Agent, or Firm—Joseph J. Laks; Robert B. Levy; Jeffrey D. Hale

(57) ABSTRACT

Cordless communication techniques for cordless communication devices having a handset unit and a base unit are provided. Such techniques can utilize a modulation method for Frequency Division Duplex/Time Division Duplex (FDD/TDD) that overcomes deficiencies of prior art devices, for example, by eliminating the need for a burst mode controller for both Frequency Division Duplex and Time Division Duplex, as well as surface acoustic wave bandpass filters and dielectric low pass filters.

9 Claims, 3 Drawing Sheets

MODULATION SCHEME FOR FDD/TDD TRANSCEIVERS

This application claims the benefit under 35 U.S.C. § 365 of International Application PCT/US01/06401,filed Feb. 28, 2001, which claims the benefit of U.S. Provisional Application, Ser. No. 60/185,531 filed Feb. 28, 2000.

BACKGROUND OF THE INVENTION

1. Field of the Invention

The present invention relates generally to transceivers and, in particular, to a modulation method for Frequency Division Duplex/Time Division Duplex (FDD/TDD) transceivers.

2. Description of Related Art

Most architectures for low cost 900 MHz and 2.4 GHz portable residential wireless systems employ either Frequency Division Duplex (FDD) or Time Division Duplex (TDD) architectures. TDD architectures use digital modulation schemes so that digitized voice can be buffered and burst out during a transmission and then converted back to a normal rate after rate conversion in the receiver base band circuits. The TDD architectures result in very low cost radio frequency (RF) architectures as there is no need for Duplex filters and also due to the fact that only one phased locked loop (PLL) is needed to support a two-way communication link. However, due to the cost constraints on realizing an Integrated Circuit (IC) with all the necessary base band signal processing, a TDD approach is not the lowest cost solution.

Frequency Division Duplex is generally used by analog systems that transmit and receive at distinctly different frequency bands. To prevent transmitter power from degrading receiver performance, expensive surface acoustic wave (SAW) or dielectric filters are used in the front end. In FDD, since the analog signal is transmitted without conversion into the digital domain, the cost of the base band sections are low. However, the RF sections are more expensive and the receive and transmit bands occupy a relatively small bandwidth of the available spectrum. In contrast, a TDD system is capable of operating over the entire available bandwidth.

Accordingly, there is a need for a modulation method that overcomes the preceding deficiencies of the prior art approaches.

SUMMARY OF THE INVENTION

The problems stated above, as well as other related problems of the prior art, are solved by the present invention, a modulation method for Frequency Division Duplex/Time Division Duplex (FDD/TDD) transceivers. The invention eliminates the need for a burst mode controller for both FDD and TDD, as well as SAW bandpass filters and dieletric low pass filters.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to a modulation method for Frequency Division Duplex/Time Division Duplex (FDD/TDD) transceivers. In particular, a technique is provided for realizing a TDD system with minimal changes to the existing FDD approach. The TDD system could either use the existing dual phase locked loop (PLL) (see dual PLL/pre-scaler 220, FIG. 2) or the Tx and Rx frequencies at the band edge as is in the FDD approach. The invention is primarily intended for use in cordless telephone sets having a handset unit (handset) and a base unit (base). Of course, the invention may be applied with respect to other cordless communication devices, while maintaining the spirit and scope thereof.

The invention facilitates the use of a single band pass filter (BPF) for the RF front-end, which operates between 902 Mhz to 928 MHz to reject strong out-of-band signals. The conventional FDD approach uses a surface acoustic wave (SAW) filter in the receiver section and a 2-pole dielectric filter or printed transmission line filters for the transmitter section. It is to be appreciated that the present invention provides a significant cost savings as compared to the prior art. To further reduce cost, the architecture can be changed to that of a single PLL type. In this case, the frequency "plan" is that of a typical TDD system, with the transmitted frequency and the received frequency being the same on both the handset and the base. The present invention can be used in an FDD mode or a TDD mode with no change to the RF front-end. In either case, significant cost savings are realized. For the FDD approach, the cost savings at least results from the elimination of the SAW and dielectric filters. For the TDD approach, the cost savings at least results from not requiring a codec and the associated audio digitization circuits, buffer storage for digitized data, and burst mode transmission circuits.

Figure 1:
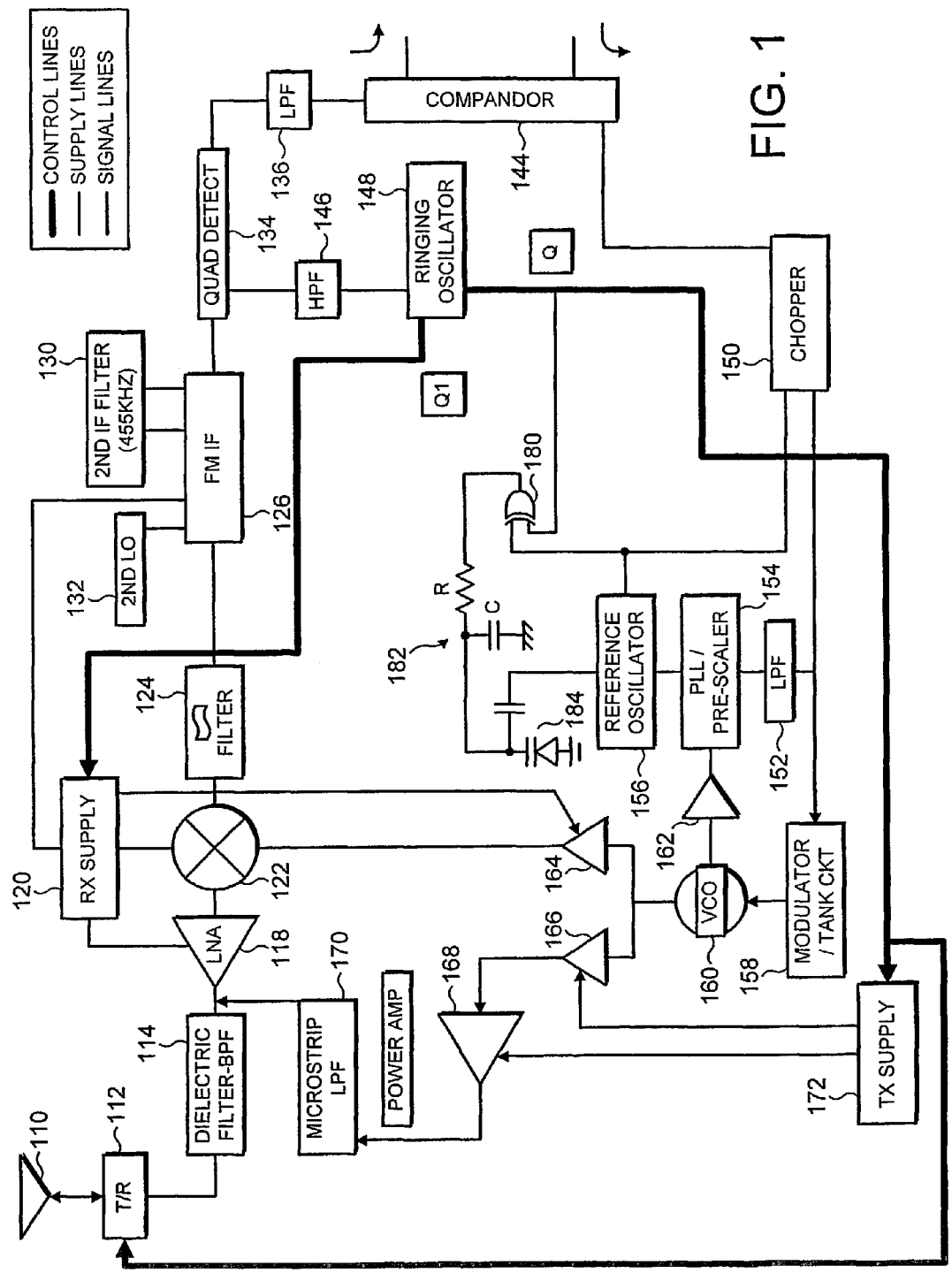
FIG. 1 is a block diagram illustrating a sampled FSK modulator in Time Division Duplex (TDD) mode, according to an illustrative embodiment of the present invention.
Figure 2:
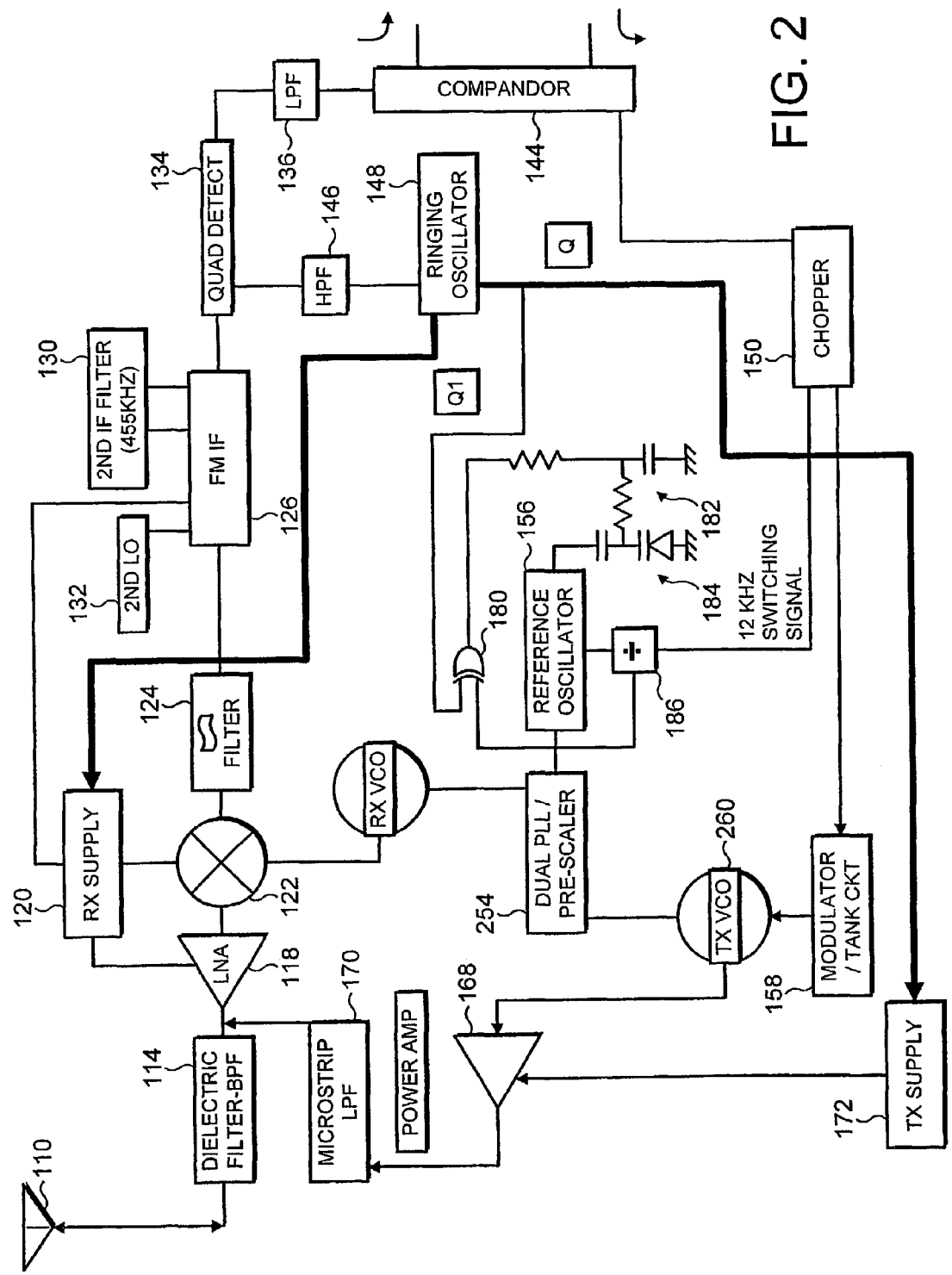
FIG. 2 is a block diagram illustrating a sampled FSK modulator in Frequency Division Duplex (FDD) mode, according to an illustrative embodiment of the present invention.

FIG. 1 is a block diagram illustrating a sampled FSK modulator in Time Division Duplex (TDD) mode, according to an illustrative embodiment of the present invention. FIG. 2 is a block diagram illustrating a sampled FSK modulator in Frequency Division Duplex (FDD) mode, according to an illustrative embodiment of the present invention. In the Figures herein, it is to be appreciated that like reference symbols indicate the same or similar components. Moreover, as used herein, the terms "Rx" and "Tx" correspond to the receiver and the transmitter, respectively, of either the handset or the base of the analog cordless telephone according to the invention.

The modulators of FIGS. 1 and 2 both include: an antenna 110; a dielectric or microstrip band pass filter 114; a low noise amplifier (LNA) 118; an Rx supply 120; a mixer 122; a 10.7 MHz/21.4 MHz filter 124; an FM intermediate frequency (IF) 126; a second ($2^{nd}$) IF filter 130; a second ($2^{nd}$) LO 132; a quadrature detector 134; a first low pass filter (LPF) 136; a compandor 144; a high pass filter (HPF) 146; a ringing oscillator 148; a chopper 150; a reference oscillator 156; a modulator/tank circuit 158; a power amp 168; a microstrip LPF 170; a Tx supply 172, an Exclusive-OR gate 180; an RC low pass filter 182; a varactor 184; and a fixed divider 186.

The modulator of FIG. 1 also includes: a transmit/receive switch (T/R) 112; a voltage controlled oscillator (VCO) 160; a first buffer amplifier 162; a second buffer amplifier 164; and a third buffer amplifier 166.

The modulator of FIG. 2 also includes a dual phase locked loop (PLL)/Pre-scaler 254 and a Tx voltage controlled oscillator (VCO) 260.

Figure 5:
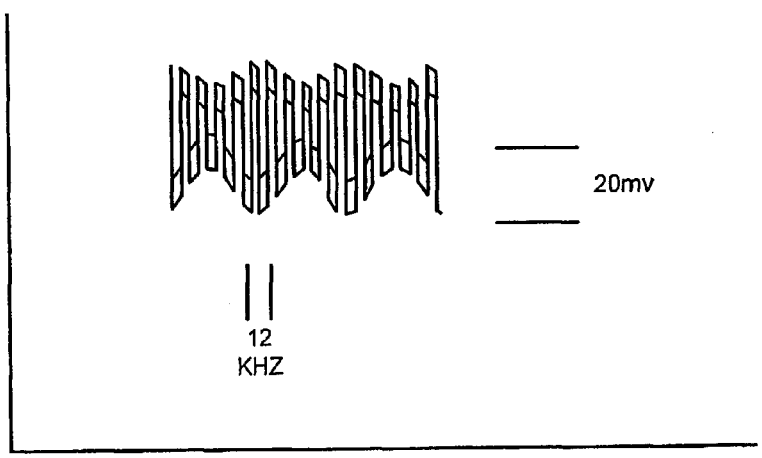
FIG. 5 is a waveform diagram illustrating a chopped analog signal, according to an illustrative embodiment of the invention.

With respect to the base of the telephone, the audio entering therein is compressed using the compandor 144 so that there is relatively less variation to the audio signal amplitude coming from a central office. The compressed audio is chopped by chopper 150 using a transistor switch at 12 Khz. This signal is further filtered to remove all the spikes at the switching boundaries. The output from the chopper 150 is a pulse amplitude modulated signal containing the base band audio chopped at 12 KHz. FIG. 5 is a waveform diagram illustrating a chopped analog signal, according to an illustrative embodiment of the invention. The digitization of the audio with the chopping signal needs to be done post priori to companding to ensure that the digitization is performed on a relatively constant amplitude audio signal. This signal is filtered and fed into the FSK modulator 158. The 12 KHz chopping square wave is generated out of, e.g., an MC 74HC14 (Schmitt trigger) configured as an oscillator. This chopper signal is also used to turn on/off the Tx supply 172 (and hence the transmitter) at the chopping rate. A 180 degree out-of-phase chopping signal is used to turn on and off the Rx supply 120 (and hence the receiver). This process ensures that the receiver is off while the transmitter is on.

On the Handset receiver side, the antenna 110 receives the signal, which is down converted to the intermediate frequency (IF) by the $2^{nd}$ IF filter 130 and the $2^{nd}$ LO 132, and detected using conventional FM quadrature coil methods by the quadrature detector 134. The recovered base band signal is a composite of a sinusoid with an overlay of the T/R chopping waveform. The composite signal is detected by the quadrature detector 134 and split into two arms. One arm passes through the low pass filter 136, which filters off the 12 Khz chopping components to output a clean sinusoid. The base band telephony signal falls within the band of 300 Hz to 3300 Hz. Since the high frequency switching waveform is 3 times the maximum low frequency audio components, the low frequency signals satisfies the Nyquist criteria for signal recovery. The signal from the second arm is high pass filtered by HPF 146 and fed into a group (3) of inverters, configured as the ringing oscillator 148, nominally at 12 Khz. High pass filtering removes all the low frequency audio components leaving a square wave pulse train that will be identical to that of the base transmitter chopping waveform. The ringing oscillator 148 will track the incoming 12 Khz signal and synchronize therewith. An inverter embodied within the ringing oscillator 148 is used to generate a complementary signal (i.e., Q1) to the synchronized signal (i.e., Q). Switching connections to handset receive and transmit sections is done in a manner that is the reverse of that done for the base.

Figure 3:
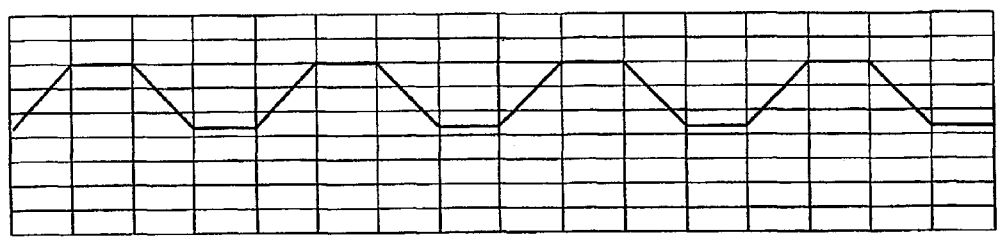
FIG. 3 is a waveform diagram illustrating a transmitter switching waveform, according to an illustrative embodiment of the invention.
Figure 4:
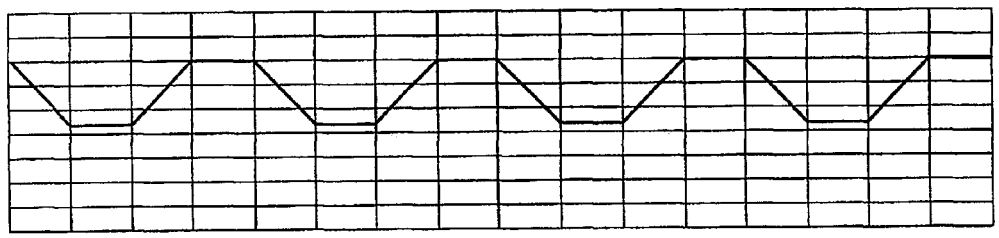
FIG. 4 is a waveform diagram illustrating a receiver switching waveform, according to an illustrative embodiment of the invention.
Figure 6:
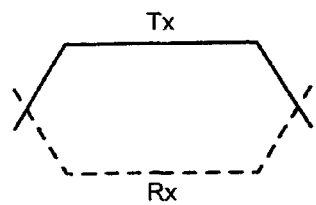
FIG. 6 is a waveform diagram illustrating a relationship between the slopes of the transmitter and receiver waveforms of FIGS. 3 and 4, respectively, according to an illustrative embodiment of the invention.

For the architecture described above, the switching waveform should be shaped appropriately to satisfy the following conditions:

a) Transmitter on/off chopping signal is slightly wave shaped (trapezoidal) so that the on period is less than (Tchop/2) the switching time of TX supply 172. This adjustment is needed to ensure that the transmitter power does not block the receiver. The TX power supply signal output from the TX supply 172 is shaped while the Rx power supply signal output from the Rx supply 120 is not shaped. This allows the RX to quickly switch off while the Tx power supply signal is ramping up. FIG. 3 is a waveform diagram illustrating a transmitter switching waveform, according to an illustrative embodiment of the invention.

b) Receiver on/off signal (180 degree phase reversed replica of the Tx switching waveform) is also similarly shaped to that of the Tx switching signal in that the waveform is trapezoidal, with the "on" time less than the actual signal (Tchop/2). The slopes of the Rx and Tx switching waveforms are adjusted for best performance. This switching methodology ensures that receiver desensitization does not happen due to transmit spectrum splatter. FIG. 4 is a waveform diagram illustrating a receiver switching waveform, according to an illustrative embodiment of the invention. FIG. 6 is a waveform diagram illustrating a relationship between the slopes of the transmitter and receiver waveforms of FIGS. 3 and 4, respectively, according to an illustrative embodiment of the invention.

It is to be appreciated that a method is also provided to further mitigate the effects of drift to the chopping signals used for T/R switching on both handset and base stations. Due to the possibility of the usage of the handset in areas having much more temperature variations (garage, yard & outside the home) than the base, it is essential to provide nominal frequency stability for chopping signals to be close to the 12 Khz chopping frequency. This can be accomplished by taking the synthesizer reference frequency and dividing by a fixed divider (not shown) to provide the switching frequency. In this scenario, the base is always considered to be the master while the handset will compare the received switching waveforms with the local (handset) switching waveform. An Exclusive-OR gate 180 is used to compare these two signals and to generate an error signal. The error signal is integrated with an RC low pass filter 182 and applied to the reference oscillator 156 for frequency correction. This method of tuning ensures that the transmitter and the receiver switching signals on the handset keep tracking to the base T/R switching signals. If the handset goes out of range, then the link will be lost; however, once the base switching waveforms are received in the handset receiver, even marginally (due to characteristics of the ringing oscillator 156), tracking will commence and the link can be re-established.

A description will now be given of some of the many advantages of the present invention. The invention provides drift compensation, thereby providing long time stability. Moreover, the invention allows for full band operation (26 Mhz). Also, the invention is alignment free. Additionally, the invention employs a low cost RF architecture. Further, the invention includes automatic clear channel selection (interference avoidance mechanism).

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A cordless communication device having a handset unit and a base unit, comprising:
   a transceiver, disposed in the handset unit, having a transmitter and a receiver,
   wherein the handset unit transceiver includes:
      at least one intermediate frequency (IF) filter adapted to filter a received audio signal to output an IF signal corresponding to the received audio signal;
      a quadrature detector adapted to input the IF signal and to output a base band signal corresponding to the received audio signal, the base band signal being a composite of a sinusoid with an overlay of a pulse amplitude modulated (PAM) signal including the received audio signal chopped at a predetermined frequency;
      a high pass filter adapted to filter the base band signal to output a square wave pulse train identical to the PAM signal; and
      a ringing oscillator adapted to generate a switching signal in synchronization with the square wave pulse train and to generate a 180 degrees out-of-phase version of the switching signal,
   wherein the transmitter is turned on and off at a predetermined frequency by the switching signal and the receiver is turned on and off by the 180 degrees out-of-phase version of the switching signal, to ensure than the receiver is turned off when the transmitter is turned on.

2. The cordless communication device according to claim 1, further comprising:
   a transceiver, disposed in the base unit having a transmitter and a receiver, wherein the base unit transceiver includes:
      a coinpandor adapted to input an audio signal and to output a compressed audio signal having less amplitude variation than the audio signal;
      a chopper adapted to input the compressed audio signal and to output the PAM signal including the audio signal chopped at the predetermined frequency;
      a modulator adapted to be controlled by the PAM signal to output a modulated signal; and
      a voltage controlled oscillator (VCO) adapted to be controlled by the modulated signal.

3. The cordless communication device according to claim 2, wherein the base unit transceiver further includes a low pass filter adapted to filter the base band signal to provide the sinusoid without the overlay of the PAM signal to the compandor.

4. The cordless communication device according to claim 1, wherein the handset transceiver further comprises:
   a phase locked loop (PLL);
   a reference oscillator adapted to provide a reference signal for the PLL; and
   a fixed divider adapted to divide the reference signal by a fixed divisor to generate a reference audio signal chopped at the predetermined frequency.

5. The cordless communication device according to claim 4, wherein the handset unit transceiver further comprises:
   a voltage controlled oscillator;
   an Exclusive-Or gate adapted to compare the switching signal with a received switching signal to generate an error signal based upon a frequency difference therebetween; and
   a resistor capacitor (RC) low pass filter adapted to integrate the error signal to provide the integrated error signal to said reference oscillator,
   wherein said reference oscillator is further adapted to correct frequencies of PAM signals generated in the handset unit with respect to PAM signals generated in the base unit and to correct reference frequencies provided to PLLs so as to correct frequencies of the VCOs in the base unit and the handset unit.

6. A cordless communication device having a handset unit and a base unit, comprising:
   a transceiver, disposed in the base unit, having a transmitter and a receiver, wherein the base unit transceiver includes:
      a compandor adapted to input an audio signal and to output a compressed audio signal having less amplitude variation than the audio signal;
      a chopper adapted to input the compressed audio signal and to output a pulse amplitude modulated (PAM) signal including the audio signal chopped at a predetermined frequency;
      a modulator adapted to be controlled by the PAM signal to output a modulated signal;
      a voltage controlled oscillator (VCO) adapted to be controlled by the modulated signal a transceiver, disposed in the handset unit, transceiver, disposed in the handset unit, having a transmitter and a receiver, wherein the handset unit transceiver includes: at least one intermediate frequency (IF) filter adapted to filter a received audio signal to output an IF signal corresponding to the received audio signal a quadrature detector adapted to input the IF signal and to output a base band signal corresponding to the received audio signal, the base band signal being a composite of a sinusoid with an overlay of a PAM signal including the received audio signal chopped at the predetermined frequency; a high pass filter adapted to filter the base band signal to output a square wave pulse train identical to the PAM signal of the base band signal.

7. The cordless communication device according to claim 6, wherein the base unit transceiver further includes a low pass filter adapted to filter the base band signal to provide the sinusoid without the overlay of the PAM signal to the compandor.

8. The cordless communication device according to claim 6, wherein the handset transceiver further comprises:
   a phase locked loop (PLL);
   a reference oscillator adapted to provide a reference signal for the PLL; and
   a fixed divider adapted to divide the reference signal by a fixed divisor to generate a reference audio signal chopped at the predetermined frequency.

9. The cordless communication device according to claim 8, wherein the handset unit transceiver further comprises:
   an Exclusive-Or gate adapted to compare the switching signal with a received switching signal to generate an error signal based upon a frequency difference therebetween; and
   a resistor capacitor (RC) low pass filter adapted to integrate the error signal to provide the integrated error signal to said reference oscillator,
   wherein said reference oscillator is further adapted to correct frequencies of PAM signals generated in the handset unit with respect to PAM signals generated in the base unit and to correct reference frequencies provided to PLLs so as to correct frequencies of the VCOs in the base unit and the handset unit.

* * * * *